United States Patent
Wuu et al.

(10) Patent No.: US 10,644,826 B2
(45) Date of Patent: May 5, 2020

(54) FLEXIBILE INTERFACES USING THROUGH-SILICON VIA TECHNOLOGY

(71) Applicant: Advanced Micro Devices, Inc., Santa Clara, CA (US)

(72) Inventors: John Wuu, Fort Collins, CO (US); Samuel Naffziger, Fort Collins, CO (US); Michael K. Ciraula, Fort Collins, CO (US); Russell Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 110 days.

(21) Appl. No.: 15/903,253

(22) Filed: Feb. 23, 2018

(65) Prior Publication Data

US 2019/0268086 A1    Aug. 29, 2019

(51) Int. Cl.
| | |
|---|---|
| *H04J 99/00* | (2009.01) |
| *H01L 23/48* | (2006.01) |
| *H01L 23/00* | (2006.01) |
| *G11C 5/06* | (2006.01) |
| *G11C 7/10* | (2006.01) |

(52) U.S. Cl.
CPC ............ *H04J 15/00* (2013.01); *H01L 23/481* (2013.01); *H01L 24/05* (2013.01); *H01L 24/17* (2013.01); *G11C 5/066* (2013.01); *G11C 7/1012* (2013.01); *H01L 2924/1436* (2013.01); *H01L 2924/1437* (2013.01)

(58) Field of Classification Search
CPC ........ G11C 5/066; G11C 7/1012; H04J 15/00; H01L 23/481
USPC ...................................... 365/189.02, 230.02
See application file for complete search history.

(56) References Cited

U.S. PATENT DOCUMENTS

| | | | |
|---|---|---|---|
| 6,154,419 A | 11/2000 | Shakkarwar | |
| 7,062,625 B1 | 6/2006 | Shrader et al. | |
| 2010/0060310 A1* | 3/2010 | Laisne | H01L 25/0657 326/10 |
| 2012/0292746 A1 | 11/2012 | Lee et al. | |
| 2013/0021866 A1 | 1/2013 | Lee | |
| 2014/0181355 A1 | 6/2014 | Barbiero et al. | |
| 2017/0033085 A1 | 2/2017 | Shikibu et al. | |

(Continued)

OTHER PUBLICATIONS

Action on the Merits by U.S.P.T.O regarding U.S. Appl. No. 15/964,647, filed Apr. 27, 2018.

*Primary Examiner* — Han Yang
(74) *Attorney, Agent, or Firm* — Polansky & Associates, P.L.L.C.; Paul J. Polansky

(57) ABSTRACT

An integrated circuit includes first and second through-silicon via (TSV) circuits and a steering logic circuit. The first TSV circuit has a first TSV and a first multiplexer for selecting between a first TSV data signal received from the first TSV and a first local data signal for transmission to a first TSV output terminal. The second TSV circuit includes a second TSV and a second multiplexer for selecting between a second TSV data signal received from the second TSV and the first local data signal for transmission to a second TSV output terminal. The steering logic circuit controls the first multiplexer to select the first local data signal and the second multiplexer to select the second TSV data signal in a first mode, and the first multiplexer to select the first TSV data signal and the second multiplexer to select the first local data signal in a second mode.

23 Claims, 7 Drawing Sheets

(56) References Cited

U.S. PATENT DOCUMENTS

2018/0096979 A1\*  4/2018  Pappu ..................... H01L 25/18
2018/0337160 A1   11/2018  Drab et al.

\* cited by examiner

FLEXIBILE INTERFACES USING THROUGH-SILICON VIA TECHNOLOGY

CROSS REFERENCE TO RELATED, COPENDING APPLICATION

Related subject matter is found in a copending patent application entitled "CONFIGURATION OF MULTI-DIE MODULES WITH THROUGH-SILICON VIAS", U.S. Patent Application No. 15/964,647, filed Apr. 27, 2018, invented by Russell Schreiber, John Wuu, Michael Ciraula, and Patrick Shyvers and assigned to the assignee hereof, now U.S. Pat. No. 10,509,752, issued Dec. 17, 2019.

BACKGROUND

Computer circuit memory systems are designed for a variety of purposes and have different characteristics. For example, main memory is usually implemented by dynamic random access memory (DRAM) chips and the DRAM system can have a data width that is selected according to its purpose. Modern DRAM memory is commonly implemented using double-data-rate (DDR) DRAM that provides efficient accesses using bursts. A central processing unit (CPU) having a cache with a 64-byte cache line size may fill or write back cache lines using eight DDR chips each organized with a by-eight (×8) data width. Since the memory system has a 64-bit data width, the CPU can access a complete 64-byte cache line using a burst length of eight. On the other hand, a graphics processing unit (GPU) having a cache with a 32-byte cache line size may fill or write back cache lines using four ×8 DDR memory chips to obtain a 32-bit width so that the GPU can access a complete 32-byte cache line using a burst length of eight. The caches themselves may also need dedicated memory to store tags and data. The cache memory system is typically implemented using static random access memory (SRAM). SRAM also can have various sizes and data widths for different caches. Thus a memory system that works well with a CPU may not work well with a GPU and vice versa, and it has been difficult to design memory systems capable of working for these various purposes.

Figure 1:
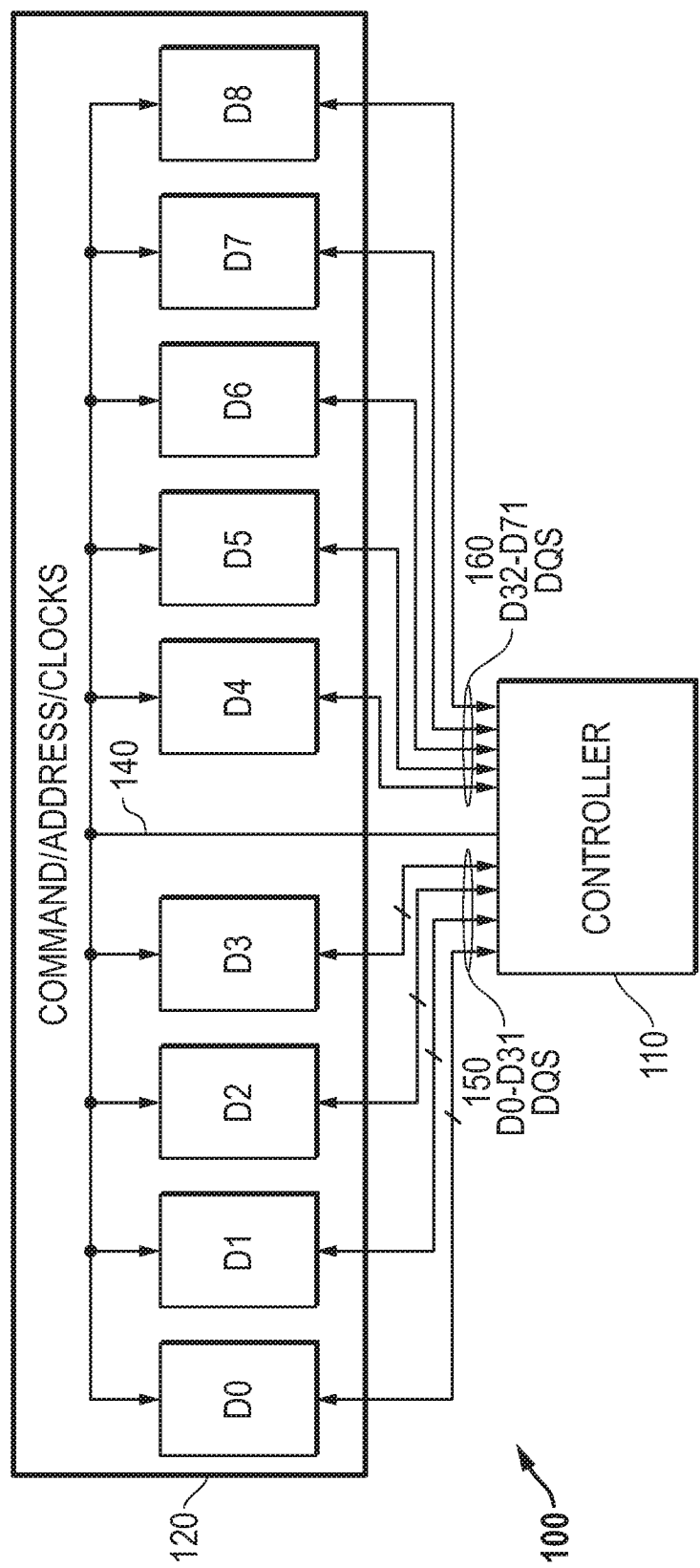
FIG. 1 illustrates in block diagram form a data processing system with a memory signal routing scheme known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Additionally, the terms remap and migrate, and variations thereof, are utilized interchangeably as a descriptive term for relocating.

DETAILED DESCRIPTION OF ILLUSTRATIVE EMBODIMENTS

As will be described in detail below, in one form an integrated circuit includes a first through-silicon via (TSV) circuit, a second TSV circuit, and a steering logic circuit. The first TSV circuit has a first TSV and a first multiplexer for selecting between a first TSV data signal received from the first TSV and a first local data signal for transmission to a first TSV output terminal. The second TSV circuit includes a second TSV and a second multiplexer for selecting between a second TSV data signal received from the second TSV and the first local data signal for transmission to a second TSV output terminal. The steering logic circuit controls the first multiplexer to select the first local data signal and the second multiplexer to select the second TSV data signal in a first mode, and controls the first multiplexer to select the first TSV data signal and the second multiplexer to select the first local data signal in a second mode.

In another form, an integrated circuit includes first through fourth through-silicon via (TSV) terminals and a bypass and multiplexing circuit. The first TSV has a top end forming a first TSV terminal, and a bottom end. The second TSV has a top end forming a second TSV terminal, and a bottom end. In a first mode, the bypass and multiplexing circuit multiplexes one of a local data signal and a signal at the bottom end of the first TSV to the third TSV terminal and couples a signal at the bottom end of the second TSV to the fourth TSV terminal. In a second mode, the bypass and multiplexing circuit couples the signal at the bottom end of the first TSV terminal to the third TSV terminal and multiplexes one of the local data signal and the signal at the bottom end of the first TSV to the third TSV terminal.

In yet another form, a stacked die assembly includes a first die and a second die. The first die includes first and second through-silicon via (TSV) circuits. The first TSV circuit has first TSV and a first multiplexer for selecting between a first TSV data signal received from the first TSV and a first local data signal for transmission to a first TSV output terminal. The second TSV circuit has a second TSV and a second multiplexer for selecting between a second TSV data signal received from a second TSV and the first local data signal for transmission to a second TSV output terminal. The second die is bonded to the first die and includes first and second through-silicon via (TSV) circuits. The first TSV circuit includes a first TSV and a first multiplexer for selecting between a first TSV data signal received from the first TSV and a first local data signal for transmission to a first TSV output terminal. The second TSV circuit includes a second TSV and a second multiplexer for selecting between a second TSV data signal received from a second TSV and the first local data signal for transmission to a second TSV output terminal. The first and second TSVs of the first die are bonded to the first and second TSV output terminals of the second die.

In still another form, a method of transmitting signals between integrated circuit dice in a die stack includes multiplexing between a first through-silicon via (TSV) data signal from a first TSV input terminal through a first TSV and a first local data signal and outputting a first multiplexed signal. The first multiplexed signal is transmitted to a first TSV output terminal. A second TSV data signal is multiplexed from a second TSV input terminal through a second TSV and a second local data signal and a second multiplexed signal is outputted. The second multiplexed signal is transmitted to a second TSV output terminal. The first local data signal and the second TSV data signal are selected in a first mode. The first TSV data signal and the second local data signal are selected in a second mode FIG. 1 illustrates in block diagram form a data processing system 100 with a memory signal routing scheme known in the prior art. Data processing system 100 includes a controller 110 and a memory 120. Controller 110 has terminals for providing command, address, and clock signals to a corresponding bus 140, and terminals for conducting a set of data input/output (I/O) signals including a lower set of signals D0-D31 on a lower data bus 150 and a set of upper data signals D32-D71 on an upper data bus 160. Memory 120 includes a set of nine memory chips labeled "D0-D8" each having inputs for receiving the command, address, and clock input terminals received from bus 140, and a set of data input/output terminals connected to one of data buses 150 and 160 for transmitting and receiving a corresponding set of data signals.

For example, controller 110 could be a microprocessor and memory 120 could be a dual-inline memory module (DIMM) compliant with a double data rate (DDR) dynamic random access memory (DRAM) standard. In this example, data processing system 100 uses "fly-by" command, address, and clock signals in which each memory chip receives the same signals, and dedicated data routing in which each memory chip is connected to a corresponding set of data signal wires. In the example shown in FIG. 1, each memory chip is configured as a by-eight (×8) chip that receives a corresponding set of eight data signals out of a total of 64 data signals for each of memory chips D0-D7 and eight error correcting code (ECC) bits for each 64-bit data element for memory chip D8.

In another example, controller 110 could be a microprocessor that includes a cache in which the cache controller is implemented on-chip, but the tag and data storage is located off-chip in memory 120. In this example, the memory chips in memory 120 would be implemented using static random access memory (SRAM) for high-speed random access.

In either of these two examples, the system is bulky and requires special signal routing for controller 110 to access desired memory locations in memory 120. Moreover the system can be expensive and also slow due to the routing delays across the significant distances involved. For example the command, address, and data signal arrive at each memory chip in a staggered fashion due to the fly-by topology, whereas the data signals arrive after about the same amount of time for each memory chip, creating variable timing skews that require training. Moreover the size of memory 120 is fixed by the number of address and data signals provided on the DIMM.

Figure 2:
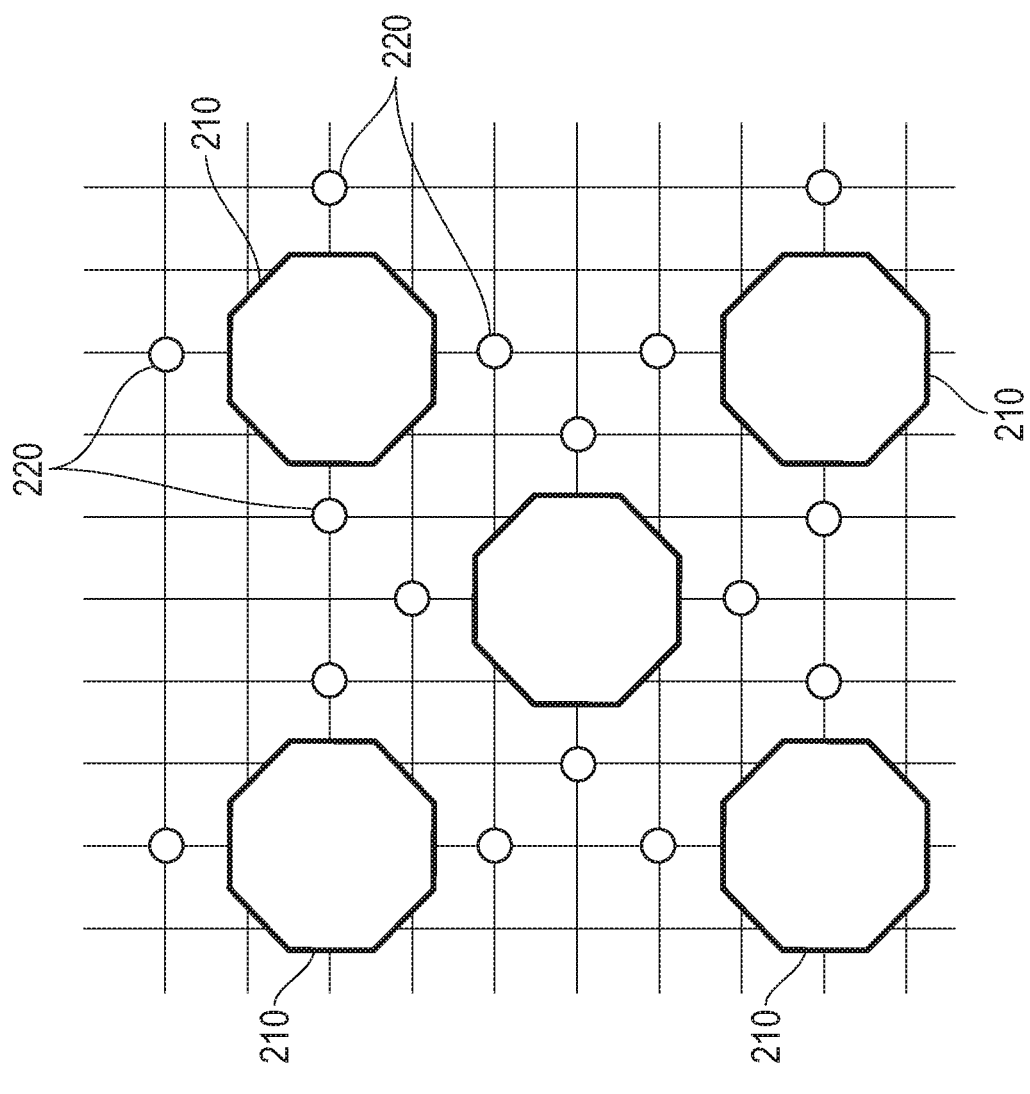
FIG. 2 illustrates a top view of a surface of an integrated circuit die using through-silicon via (TSV) technology according to some embodiments.

FIG. 2 illustrates a top view of a surface of an integrated circuit die 200 using through-silicon via (TSV) technology according to some embodiments. Integrated circuit die 200 uses two inter-chip bonding structures, namely micro-bump landing pads 210 for conventional solder bumping and hybrid bond landing pads 220 for die-to-die bonding.

Micro-bump landing pads 210 are sized to accommodate generally or approximately spherical metallic structures or pillars that can be formed of a variety of low-melting point metals and alloys, such as AgSn alloys, that will be heated to adhere to and make contact to underlying micro-bump landing pads. For use in chip-scale packaging (CSP), the micro-bump landing pads can be laid out as shown in FIG. 2 in a grid pattern across the length and width of the semiconductor die. In order to prevent shorting during the reflow process, the micro-bumps are spaced apart at certain distances to define "keepout" regions, but these distances limit the number and density of the micro-bumps on the surface of the die.

The second structures are known as hybrid bond landing pads 220, and they are shown as smaller circles in FIG. 2. Hybrid bond landing pads 220 are used to form hybrid bonds using oxide and metal from corresponding landing pads of two die. When the landing pads come into contact with corresponding TSVs of another die and the two die are heated to a temperature higher than the solder reflow temperature, for example a temperature in excess of 200 degrees Celsius (200° C.), the metal in the landing pad and the TSV diffuse into each other to form good electrical connections. Both the exposed metal and the surrounding oxide also bond to form good a physical connection. Hybrid bonding also uses facing oxide layers formed on each of two adjacent chips. Conductive islands of copper or similar metal layer are interspersed in the oxide films as can be seen in integrated circuit die 200. The chips are stacked with respective conductive islands aligned horizontally and a heating process in excess of about 200° C. is performed to bond the conductive islands together.

As can be readily seen in FIG. 2, hybrid bond landing pads 220 have significantly smaller areas than micro-bump landing pads 210 and thus integrated circuit die 200 can have a higher density of hybrid bond landing pads than micro-bump landing pads.

Hybrid bonding is just one of a variety of emerging die-to-die bonding technologies that have a smaller size and require smaller keepout regions. One alternative die-to-die bonding technology that can be used in other embodiments is known as thermal compression bonding. Using thermal compression bonding, conductive pillars are formed on each of two adjacent stacked chips and the chips are then placed into contact with each other and thermal compression bonded, i.e. bonded using both applied pressure and elevated temperature.

Another alternative die-to-die bonding technique that can be used in still other embodiments is known as direct oxide bonding. Using direct oxide bonding, facing sides of each of two adjacent stacked chips receive an oxide film. The oxide films are subsequently planarized using chemical mechanical polishing and then plasma treated to become hydrophilic. The oxide surfaces are next placed together and annealed to form a bond. Thereafter, an exposed surface of one of the chips is thinned by backgrinding. TSV etches and metal deposition or plating are then used to position TSVs of one chip to be in contract with landing pads of a subsequent chip.

Figure 3:
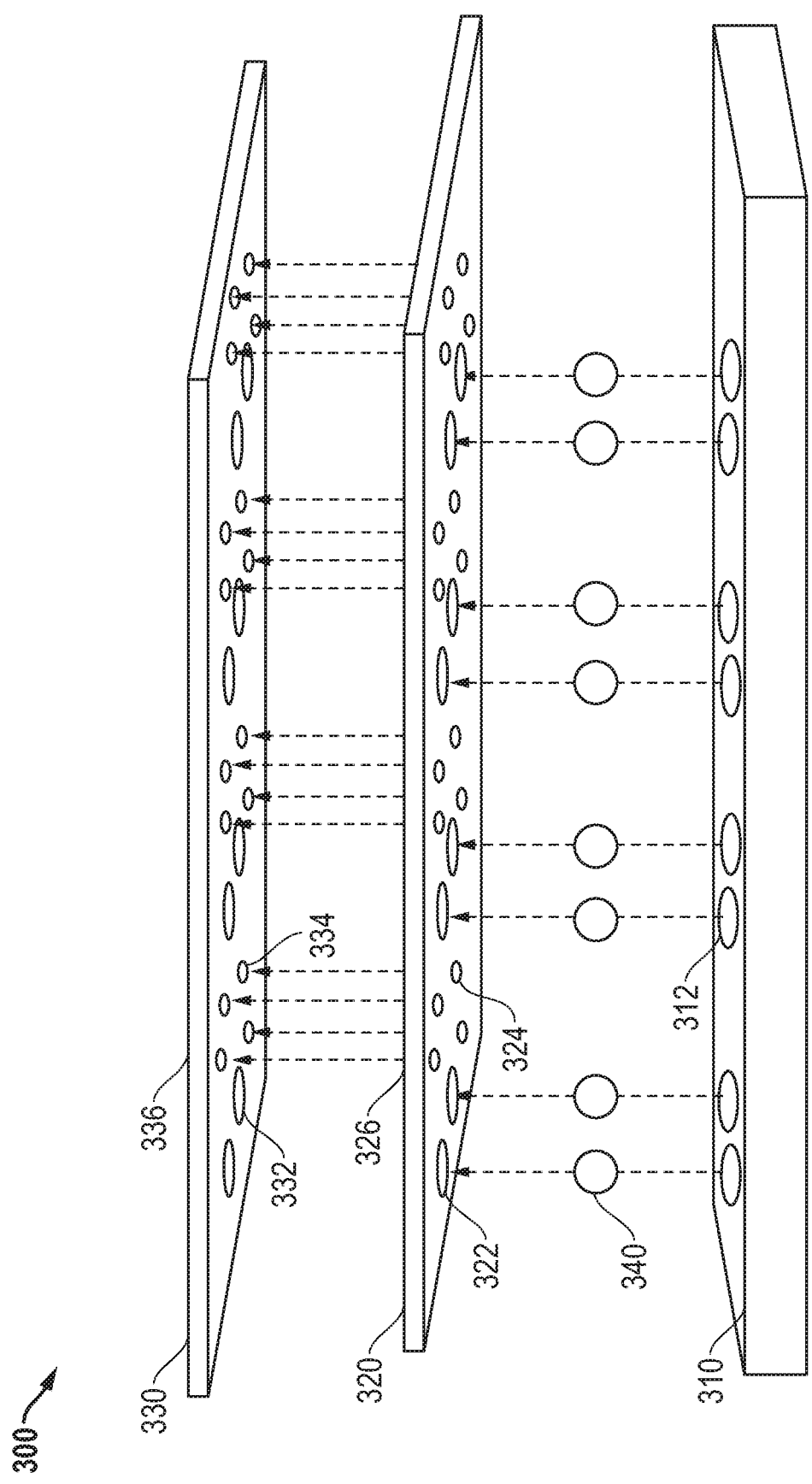
FIG. 3 illustrates a perspective view of a portion of an integrated circuit die stack according to some embodiments.

FIG. 3 illustrates a perspective view of a portion of an integrated circuit die stack 300 according to some embodiments. Integrated circuit die stack 300 includes a base die 310, a first die 320, and a second die 330. Base die 310 includes a set of micro-bump landing pads 312 on an upper surface thereof. First die 320 includes set of micro-bump landing pads 322 on a lower surface that are spatially aligned to micro-bump landing pads 312 on the upper surface of base die 310, a set of hybrid bond landing pads 324 on the lower surface, and a set of TSVs not visible in FIG. 3 that extend from active circuitry at the lower surface to the top surface of first die 320. Second die 330 includes a set of micro-bump landing pads 332 on a bottom surface that are spatially aligned to micro-bump landing pads 312 on the upper surface of base die 310, a set of hybrid bond landing pads 334 on the lower surface that are spatially aligned to a top of the TSVs on the top surface of second die 330, and a set of TSVs not visible in FIG. 3 that extend from active circuitry at the lower surface to the top surface of second die 330.

First die 320 is connected to base die 310 using micro-bump technology. For example, a set of corresponding micro-bumps 340 can be placed or deposited on the top surface of base die 310. First die 320 is bonded to base die 310 when it is aligned to base die 310 and the two die are heated. When the two dice are heated, the solder bumps reflow and bond, electrically and mechanically, to both the micro-bump landing pads 312 on the upper surface of base die 310 and the corresponding micro-bump landing pads 322 on the lower surface of first die 320. First die 320 communicates with base die 310 using signals conducted through micro-bumps 340. The hybrid bond landing pads 220 on the lower surface of first die 320 are present on the die, but not used.

On the other hand, second die 330 communicates with first die 320 using signals conducted to and/or from first die 320 through the TSVs 326 of first die 320 and hybrid bond landing pads 334 of second die 330 when hybrid bonds are formed between the two die. First die 320 internally switches the signal paths from the micro-bumps to the hybrid bonds, allowing signals to be conducted between base die 310 and either first die 320 or second die 330.

Contract assembly facilities known as outsourced assembly and test (OSAT) facilities can assemble a base die to a die stack. However wafer fabrication facilities assemble the dice in the die stack using die-to-die bonding techniques (such as hybrid bonding), which require a relatively high temperature and a compatible process technologies.

Moreover the wafer fabrication facilities need only manufacture a single, universal die that can be used as either the first die or a subsequent die in the die stack, and can assemble different die stacks having differing numbers of the same universal die according to customer demand. In particular in the case of a memory die stack, the presence of both the micro-bump landing pads and hybrid bond landing pads on the lower surface allows each die to serve as either a first die communicating with the base die or a subsequent die (such as second die 330) using a universal die design. Thus the hybrid approach provides significant flexibility for memory system design.

In another aspect, the smaller size and surface areas of the hybrid bond landing pads and associated through-silicon vias allow additional data signals to be supported in a given amount of die area so that the memory die stack can be configured for various data sizes. For example in the two-die stack of FIG. 3, the size can be doubled by adding two more subsequent dice that are bonded to the upper surface of second die 330 using die-to-die bonding. In general for a die stack including N die, the data size can be up to N times as large as the data size of each single die.

In the particular example shown in FIG. 3, each memory die has two TSV circuits for each signal line, one that conducts a local signal and another that operates as a pass through for signals conducted from one die to the next. If each die supported a width of 32 data bits, a two-die stack could support a width of 64 bits, a three-die stack could support a width of 96 bits, and so on. Each die includes a steering logic circuit that conducts data signal to and/or from either a local circuit, for example a memory array, or another die in the stack.

Figure 4:
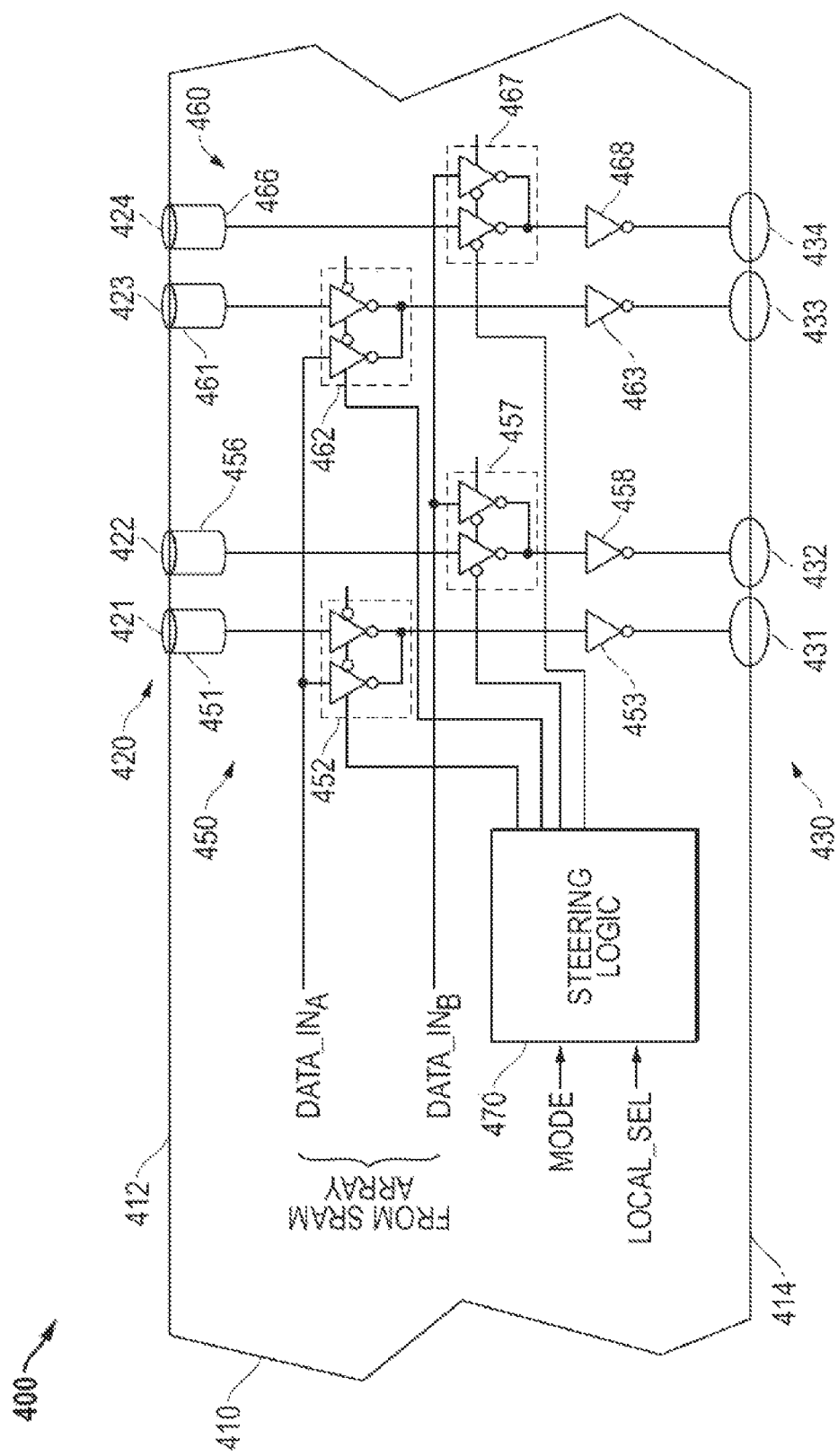
FIG. 4 illustrates in block diagram form a portion of an integrated circuit die for use in the integrated circuit die stack of FIG. 3 according to some embodiments.

FIG. 4 illustrates in block diagram form a portion of an integrated circuit die 400 for use in integrated circuit die stack 300 of FIG. 3 according to some embodiments. Integrated circuit die 400 includes a semiconductor substrate 410 having a first major surface 412 on a top side and a second major surface 414 on a bottom side of integrated circuit die 400 as the die is oriented in FIG. 4. In this example, the active surface corresponds to second major surface 414. First major surface 412 includes a set of TSV terminals 420 including TSV terminals 421-424. In one form, TSV terminals 420 are top ends of TSVs. Second major surface 414 includes a set of TSV terminals 430 including TSV terminals 431-434. In one form, TSV terminals 430 are hybrid bond landing pads on second major surface 414 of suitable size and placement for bonding to corresponding TSVs of an underlying die using hybrid bonding.

Integrated circuit die 400 includes generally a first TSV circuit 450, a second TSV circuit 460, and a steering logic circuit 470. First TSV circuit 450 includes a TSV 451, a first multiplexer 452, an inverter 453, a TSV 456, a second multiplexer 457, and an inverter 458. TSV 451 has a top end forming TSV terminal 421, and a bottom end. First multiplexer 452 includes a first input for receiving a first local data signal labeled "DATA_IN$_A$", a second input connected to the bottom end of TSV 461, a control input, and an output. Inverter 453 has an input connected to the output of multiplexer 452, and an output connected to TSV terminal 431. TSV 456 has a top end forming TSV terminal 422, and a bottom end. Second multiplexer 457 includes a first input for receiving a second local data signal labeled "DATA_IN$_B$", a second input, a control input, and an output. Inverter 458 has an input connected to the output of multiplexer 457, and an output connected to TSV terminal 432.

Second TSV circuit 460 includes a TSV 461, a first multiplexer 462, an inverter 463, a TSV 466, a second multiplexer 467, and an inverter 468. TSV 461 has a top end forming TSV terminal 423, and a bottom end. First multiplexer 462 includes a first input for receiving first local data signal DATA_IN$_A$, a second input connected to the bottom end of TSV 461, a control input, and an output. Inverter 463 has an input connected to the output of multiplexer 462, and an output connected to TSV terminal 433. TSV 466 has a top end forming TSV terminal 424, and a bottom end. Second multiplexer 467 includes a first input for receiving second local data signal DATA_IN$_B$, a second input, a control input, and an output. Inverter 468 has an input connected to the output of multiplexer 457, and an output connected to TSV terminal 432. As shown in FIG. 4, multiplexers 452, 457, 462, and 467 are implemented as switched inverters, but other multiplexer types may be used as well.

Steering logic circuit 470 has a first input for receiving a mode signal labeled "MODE", a second input for receiving a decoded address signal labeled "LOCAL_SEL", and four outputs respectively connected to the control inputs of multiplexers 452, 457, 462, and 467.

In operation, steering logic circuit 470 selects particular data inputs based on address decoding and the configuration of integrated circuit die 400. MODE indicates whether the die is an odd die or an even die in a die stack, and LOCAL_SEL indicates whether the die has been selected by an address decoding operation. The decoding operation is summarized in TABLE I below:

TABLE I

| MODE | LOCAL_SEL | Select 452 | Select 457 | Select 462 | Select 467 |
|---|---|---|---|---|---|
| ODD | 0 | $TSV_{451}$ | $TSV_{456}$ | $TSV_{461}$ | $TSV_{466}$ |
| ODD | 1 | $DATA\_IN_A$ | $DATA\_IN_B$ | $TSV_{461}$ | $TSV_{466}$ |
| EVEN | 0 | $TSV_{451}$ | $TSV_{456}$ | $TSV_{461}$ | $TSV_{466}$ |
| EVEN | 1 | $TSV_{451}$ | $TSV_{456}$ | $DATA\_IN_A$ | $DATA\_IN_B$ |

In TABLE I, MODE indicates whether the die is an odd die (MODE=ODD) or an even die (MODE=EVEN) in a 2N die stack, in which the die closest to the base die is the first or odd die, the next subsequent die is the second or even die, and so on. $TSV_{462}$ indicates that multiplexer 462 selects the input from TSV 461, and so on. Thus when MODE is ODD and LOCAL_SEL is 0, steering logic circuit 470 switches multiplexers 452, 457, 462, and 467 to provide the signals received from TSVs 451, 456, 461, and 466 to TSV terminals 431-434, respectively, thus allowing die stacks of greater than two die. When MODE is ODD and LOCAL_SEL is 1, steering logic circuit 470 switches multiplexers 452 and 457 to provide local data signals $DATA\_IN_A$ and $DATA\_IN_B$ to TSV terminals 431 and 432, respectively, and multiplexers 462 and 467 to provide signals received from TSVs 461 and 461 to TSV terminals 433 and 434, respectively. When MODE is EVEN and LOCAL_SEL is 0, steering logic 470 switches multiplexers 452, 457, 462, and 467 to provide the signals received from TSVs 451, 456, 461, and 466 to TSV terminals 431-434, respectively. When MODE is EVEN and LOCAL_SEL is 1, steering logic 470 switches multiplexers 452 and 457 to provide signals received from TSVs 451 and 455 to TSV terminals 431 and 432, respectively, and multiplexers 462 and 467 to provide local data signals $DATA\_IN_A$ and $DATA\_IN_B$ to TSV terminals 433 and 434, respectively.

In some embodiments, a 2N die stack can be formed with greater than two die, so long as the number of die in the stack are multiples of 2. In this case the die's address decoder and/or steering logic circuit 470 provides an extra level of decoding. Thus if the address selects data from a different die pair, then LOCAL_SEL is 0 and steering logic circuit 470 (and a comparable steering logic circuit in a companion stacked die) enables the TSV inputs of all multiplexers enables all sets of TSVs in multiples of 2 that allows it to be used with various memory organizations. In some other embodiments, the number of die in the die stack and the number of data signals sets can be greater than two.

The exemplary memory die stack disclosed is a "memory cube" for use with a data processor (e.g., multi-core processor, graphics processor unit (GPU), accelerated processing unit including both a central processing unit (CPU) and a GPU, and the like) as the base die. Since the process technology will likely be different for the data processor die and the memory die, they can be fabricated separately. OSAT facilities are capable of performing inter-die assembly using micro-bumps because of the relatively large micro-bump landing pad side and the low reflow temperatures, but not die-to-die bonding such as hybrid bonding. The die stack connects the first die to the processor using the micro-bump interface, while using smaller-pitch die-to-die bonding techniques such as hybrid bonding to interconnect the die in the die stack. Thus, an additional multiplexer not shown in FIG. 4 selects a micro-bump interface or a hybrid bond interface in the first die of the die stack. To support a universal die design, the micro-bump interface is present in all die but only used when the die is the first die in the die stack.

Also integrated circuit die 400 shows a die in which the active circuitry sits beneath the TSVs as the die is oriented in FIG. 4 and thus the signals travel in a direction from the top surface to the bottom, active surface. However the principles discussed herein apply regardless of the direction of signal travel. Moreover the signals can also be bidirectional signals with the addition of corresponding multiplexers for conducting signals in the other direction and additional control signals to enable the multiplexers or place them in a high impedance state.

Figure 5:
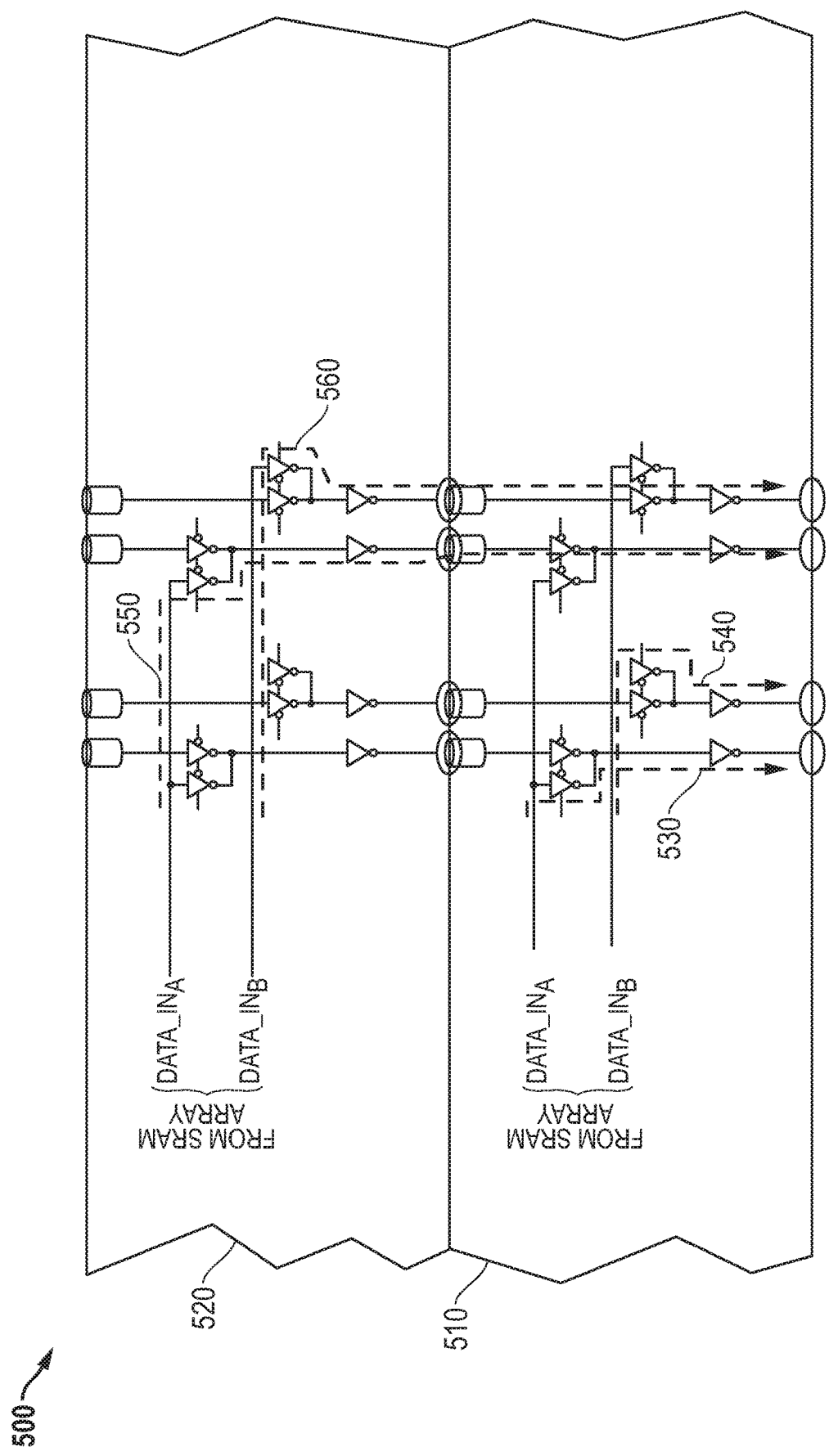
FIG. 5 illustrates in block diagram form a die stack showing portions of two integrated circuit die similar to the integrated circuit die of FIG. 4.

FIG. 5 illustrates in block diagram form a die stack 500 showing portions of two integrated circuit die similar to integrated circuit die 400 of FIG. 4. Die stack 500 includes a first integrated circuit die 510 at a bottom of die stack 500 and a second integrated circuit die 520 above integrated circuit die 510 in the die stack. Each of integrated circuit die 510 and integrated circuit die 520 is constructed the same as integrated circuit die 400 of FIG. 4 but configured differently, and the steering logic circuit is omitted to simplify the discussion. In this case, each die is configured as part of a double die stack in which integrated circuit die 510 is a first or odd die, and integrated circuit die 520 is a second or even die. Thus the steering logic in integrated circuit die 510 provides its local data over paths 530 and 540 to the left two landing pads. The steering logic in integrated circuit die 520 provides its local data over paths 550 and 560 to the right two landing pads, while the steering logic circuit in integrated circuit die 510 allows this data to flow through its TSVs and selector circuits to its right two hybrid bond landing pads at the bottom of integrated circuit die 510. The data width of die stack 500 is 2N, where N is the data width of one die.

If die stack 500 is part of a larger die stack with a lower die bonded to the base die, then each of integrated circuit die 510 and 520 would be subsequent die. In this case the landing pads at the bottom of integrated circuit die 510 would connect to corresponding landing pads on the top of an additional two-die die stack. If die stack 500 only included two die, then integrated circuit die 510 would be a first die, and integrated circuit die 520 would be a subsequent die. In this case, the additional multiplexer (not shown in FIG. 2) would connect paths 530 and 540 to micro-bump landing pads for subsequent assembly to a base die.

Figure 6:
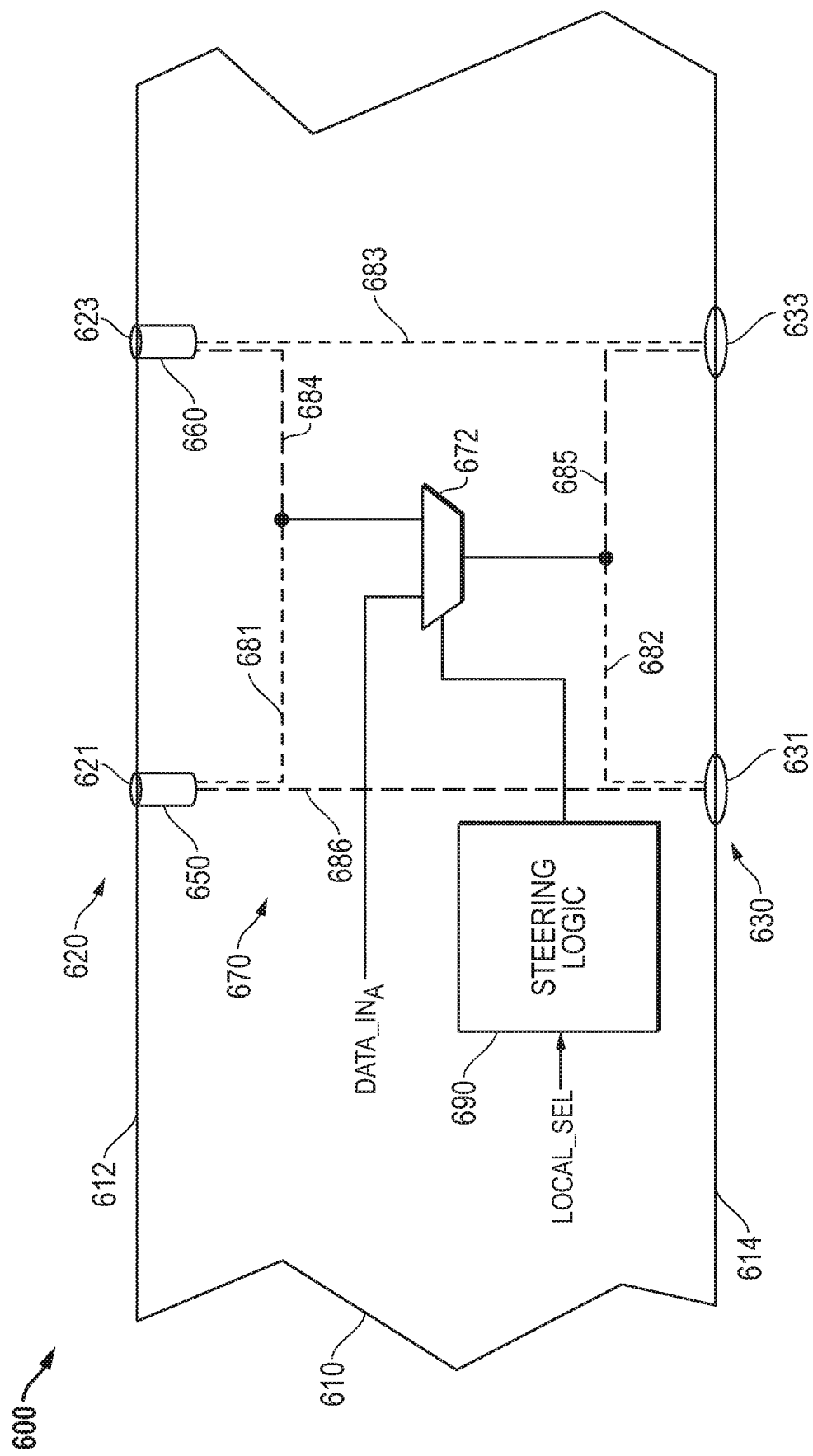
FIG. 6 illustrates in block diagram form a portion of an integrated circuit die for use in the integrated circuit die stack of FIG. 3 according to some embodiments.

FIG. 6 illustrates in block diagram form a portion of an integrated circuit 600 for use in the integrated circuit die stack of FIG. 3 according to some embodiments. Integrated circuit die 600 includes a semiconductor substrate 610 having a first major surface 612 on a top side and a second major surface 614 on a bottom side of integrated circuit die 610 as the die is oriented in FIG. 6. In this example, the active surface corresponds to second major surface 614. First major surface 612 includes a set of TSV terminals 620 including TSV terminals 621 and 623. In one form, TSV terminals 620 are top surfaces of TSVs. Second major surface 614 includes a set of TSV terminals 630 including TSV terminals 631 and 633. In one form, TSV terminals 630 are hybrid bond landing pads on second major surface 614 of suitable size and placement for bonding to corresponding TSVs of an underlying die using hybrid bonding.

Integrated circuit die 600 also includes a first TSV 650, a second TSV 660, a bypass and multiplexing circuit 670, and a steering logic circuit 690. TSV 650 has a top end forming TSV terminal 621, and a bottom end. TSV 660 has a top end forming TSV terminal 623, and a bottom end. Bypass and multiplexing circuit 670 includes a multiplexer 672 and a set of metal routing channels 680. Multiplexer 672 includes a first input for receiving local data signal DATA INA, a second input, a control input, and an output. Metal routing channels 680 include metal routing channels 681-686. Metal routing channel 681 selectively connects the bottom end of TSV 650 to the second input of multiplexer 672. Metal routing channel 682 selectively connects the output of multiplexer 672 to TSV terminal 631. Metal routing channel 683 selectively connects the bottom end of TSV 660 to TSV terminal 633. Metal routing channel 684 selectively connects the bottom end of TSV 660 to the second input of multiplexer 672. Metal routing channel 685 selectively connects the output of multiplexer 672 to TSV terminal 633. Metal routing channel 686 selectively connects the bottom end of TSV 650 to TSV terminal 631.

Steering logic circuit 690 has an input for receiving decoded address signal LOCAL_SEL, and an output connected to the control inputs of multiplexer 672. Integrated circuit die 600 will typically support several data signals, but only two are shown in FIG. 6 for ease of illustration.

In operation, integrated circuit die 600 is capable of being configured as an odd die or an even die according to a metal option selected during wafer fabrication. If integrated circuit die 600 is configured as an odd die, metal routing channels 681-683 have metal and metal routing channels 684-686 have no metal. Metal routing channel 681 connects the bottom end of TSV 650 to the second input of multiplexer 672, metal routing channel 682 connects the output of multiplexer 672 to TSV terminal 631, and metal routing channel 683 connects the bottom end of TSV 660 to TSV terminal 633.

If integrated circuit die 600 is configured as an even die, metal routing channels 681-683 have no metal and metal routing channels 684-686 have metal. Metal routing channel 684 connects the bottom end of TSV 660 to the second input of multiplexer 672, metal routing channel 685 connects the output of multiplexer 672 to TSV terminal 633, and metal routing channel 686 selectively connects the bottom end of TSV 650 to TSV terminal 631.

Steering logic circuit 690 provides its output to select the first input of multiplexer 672 if LOCAL_SEL=1, and to select the second input of multiplexer 672 if LOCAL_SEL=0.

The chip manufacturer configures integrated circuit die 600 as an odd die or as an even die at the back end of wafer fabrication using a metal option. By implementing the selection as a metal mask option, the manufacturer can manufacture generic die up until a late stage of fabrication, and only then select the die to be an even die or an odd die according to customer demand. In addition, integrated circuit die 600 need only have half the number of multiplexers as integrated circuit die 400 of FIG. 4 has. Because the multiplexers drive signals from one chip to the next chip over TSVs using hybrid bonds, they have a relatively large circuit area and by not including unused multiplexers, the savings in circuit area and cost can be significant.

Figure 7:
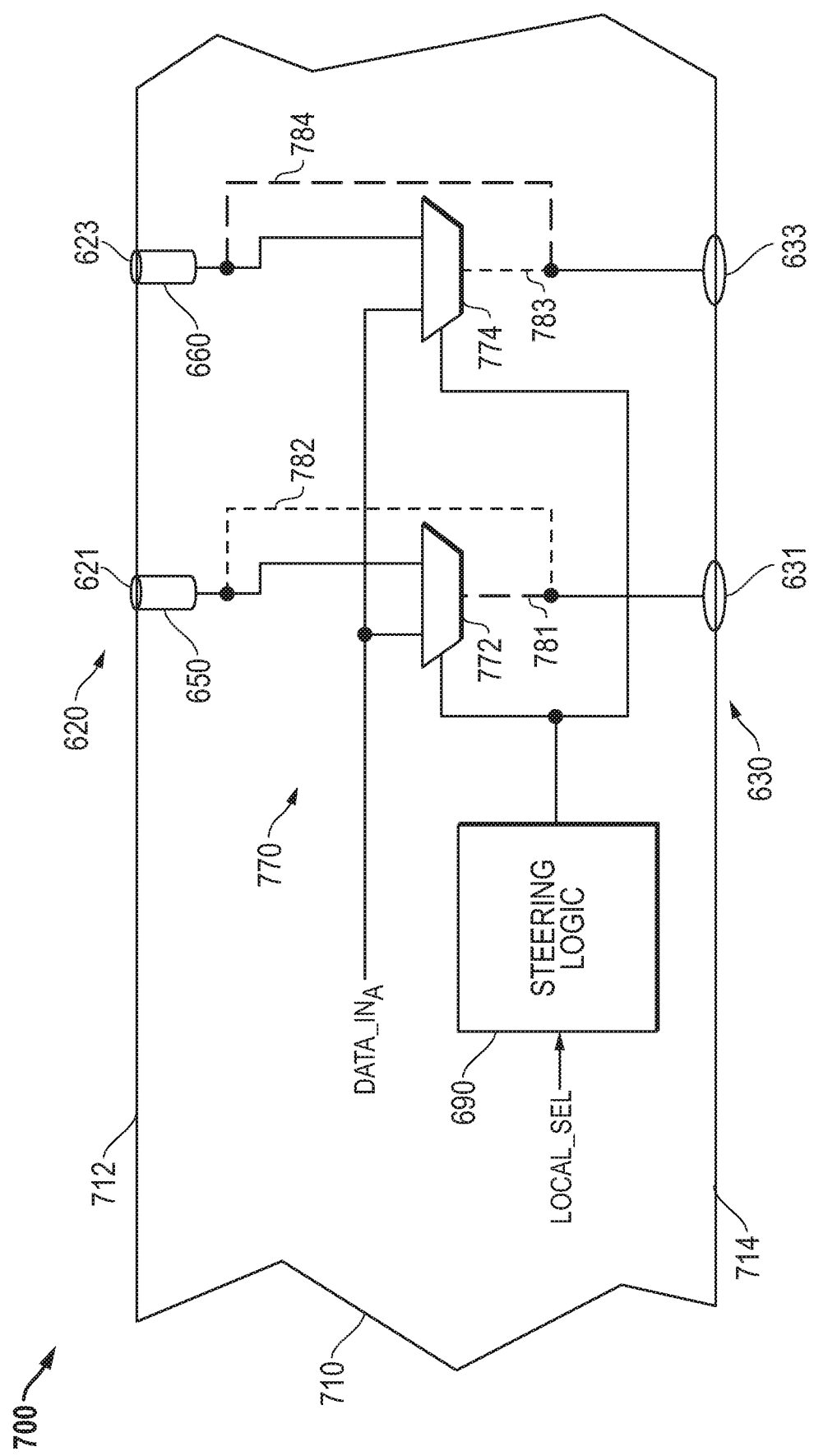
FIG. 7 illustrates in block diagram form a portion of an integrated circuit die for use in the integrated circuit die stack of FIG. 3 according to some embodiments.

FIG. 7 illustrates in block diagram form a portion of an integrated circuit die 700 for use in the integrated circuit die stack of FIG. 3 according to some embodiments. Integrated circuit die 700 is similar to integrated circuit die 600 except that it uses a bypass and multiplexing circuit 770 in place of bypass and multiplexing circuit 670. Bypass and multiplexing circuit 770 includes multiplexers 772 and 774, and metal routing channels 782 and 784. Multiplexer 772 has a first input for receiving the DATA_IN$_A$ signal, a second input connected to the second end of TSV 650, and an output connected to TSV terminal 631. Multiplexer 774 has a first input for receiving the DATA_IN$_A$ signal, a second input connected to the second end of TSV 660, and an output connected to TSV terminal 633. Metal routing channel 781 selectively connects the output of multiplexer 772 to TSV terminal 631. Metal routing channel 782 selectively connects the bottom end of TSV 650 to TSV terminal 631. Metal routing channel 783 selectively connects the output of multiplexer 774 to TSV terminal 633. Metal routing channel 784 selectively connects the bottom end of TSV 650 to TSV terminal 633.

In operation, integrated circuit die 700 is also capable of being configured as an odd die or an even die according to a metal option selected during wafer fabrication. If integrated circuit die 700 is configured as an odd die, metal routing channels 782 and 783 have no metal and metal routing channels 781 and 784 have metal. Multiplexer 772 selects either the DATA_IN$_A$ signal or the signal received from the bottom end of TSV 650 to provide to TSV terminal 631, while the data received from TSV terminal 623 bypasses multiplexer 774 and flows directly to TSV terminal 633.

If integrated circuit die 700 is configured as an even die, metal routing channels 782 and 783 have metal and metal routing channels 781 and 784 have no metal, and multiplexer 774 selects either the DATA_IN$_A$ signal or the signal received from the bottom end of TSV 660 to provide to TSV terminal 633, while the data received from TSV terminal 621 bypasses multiplexer 772 and flows directly to TSV terminal 631.

Integrated circuit die 700 provides similar benefits as integrated circuit die 600. It requires greater circuit area, but provides a greater uniformity in layout.

Integrated circuit die 400, 600, or 700 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:
1. An integrated circuit die comprising:
a first through-silicon via (TSV) circuit comprising a first TSV and a first multiplexer for selecting between a first TSV data signal received from said first TSV and a first local data signal for transmission to a first TSV output terminal;

a second TSV circuit comprising a second TSV and a second multiplexer for selecting between a second TSV data signal received from said second TSV and said first local data signal for transmission to a second TSV output terminal; and a steering logic circuit for controlling said first multiplexer to select said first local data signal and said second multiplexer to select said second TSV data signal in a first mode, and controlling said first multiplexer to select said first TSV data signal and said second multiplexer to select said first local data signal in a second mode.

2. The integrated circuit die of claim 1, wherein:
said first and second TSV output terminals comprise landing pads adapted to bond to a corresponding TSV using a die-to-die bonding technique.

3. The integrated circuit die of claim 2, wherein:
said die-to-die bonding technique comprises hybrid bonding.

4. The integrated circuit die of claim 1, wherein said first mode corresponds to a configuration as an odd die of a die stack, and said second mode corresponds to configuration as an even die of the die stack.

5. The integrated circuit die of claim 1, wherein said steering logic circuit is further responsive to a decoded address, and controls said first multiplexer to select said first local data signal in said first mode if said decoded address selects the integrated circuit die, and controls said first multiplexer to select said first TSV data signal in said first mode if said decoded address does not select the integrated circuit die.

6. An integrated circuit die comprising:
a first through-silicon via (TSV) having a top end forming a first TSV terminal, and a bottom end;
a second TSV having a top end forming a second TSV terminal, and a bottom end;
a third TSV terminal;
a fourth TSV terminal; and
a bypass and multiplexing circuit that in a first mode multiplexes one of a local data signal and a signal at said bottom end of said first TSV to said third TSV terminal and couples a signal at said bottom end of said second TSV to said fourth TSV terminal, and in a second mode couples said signal at said bottom end of said first TSV to said third TSV terminal and multiplexes one of said local data signal and said signal at said bottom end of said second TSV to said fourth TSV terminal.

7. The integrated circuit die of claim 6, wherein said bypass and multiplexing circuit comprises:
a multiplexer having a first input for receiving said local data signal, a second input, and an output; and
a plurality of metal routing channels including a first metal routing channel between a bottom end of said first TSV and said second input of said multiplexer, a second metal routing channel between an output of said multiplexer and said third TSV terminal, a third metal routing channel between a bottom end of said second TSV and said fourth TSV terminal, a fourth metal routing channel between a bottom end of said second TSV and said second input of said multiplexer, a fifth metal routing channel between an output of said multiplexer and said fourth TSV terminal, and a sixth metal routing channel between a bottom end of said first TSV and said third TSV terminal.

8. The integrated circuit die of claim 7, wherein when configured in said first mode, the integrated circuit die has metal in said first metal routing channel, said second metal routing channel, and said third metal routing channel but no metal in said fourth metal routing channel, said fifth metal routing channel, and said sixth metal routing channel.

9. The integrated circuit die of claim 7, wherein when configured in said second mode, wherein the integrated circuit die has no metal in said first metal routing channel, said second metal routing channel, and said third metal routing channel but has metal in said fourth metal routing channel, said fifth metal routing channel, and said sixth metal routing channel.

10. The integrated circuit die of claim 6, wherein said bypass and multiplexing circuit comprises:
a first multiplexer having a first input for receiving said local data signal, a second input coupled to said bottom end of said first TSV, and an output coupled to said third TSV terminal; and
a second multiplexer having a first input for receiving said local data signal, a second input coupled to said bottom end of said second TSV, and an output coupled to said second TSV terminal;
a first bypass channel between a bottom end of said first TSV and said third TSV terminal; and
a second bypass channel between a bottom end of said second TSV and said fourth TSV terminal.

11. The integrated circuit die of claim 10, wherein when in said first mode the integrated circuit die has a metal in said second bypass channel but no metal segment in said first bypass channel.

12. The integrated circuit die of claim 10, wherein when in said second mode the integrated circuit die has no metal in said second bypass channel but has metal segment in said first bypass channel.

13. The integrated circuit die of claim 6, further comprising:
a steering logic circuit responsive to a decoded address to select said local data signal if said decoded address selects the integrated circuit die, and to select said bottom end of one of said first and second TSVs if said decoded address does not select the integrated circuit die.

14. A die stack comprising:
a first die comprising:
a first through-silicon via (TSV) circuit comprising a first TSV and a first multiplexer for selecting between a first TSV data signal received from said first TSV and a first local data signal for transmission to a first TSV output terminal; and
a second TSV circuit comprising a second TSV and a second multiplexer for selecting between a second TSV data signal received from a second TSV and said first local data signal for transmission to a second TSV output terminal;
a second die bonded to said first die comprising:
a first TSV circuit comprising a first TSV and a first multiplexer for selecting between a first TSV data signal received from said first TSV and a first local data signal for transmission to a first TSV output terminal;
a second TSV circuit comprising a second TSV and a second multiplexer for selecting between a second TSV data signal received from a second TSV and said first local data signal for transmission to a second TSV output terminal; and
wherein said first and second TSVs of said first die are bonded to said first and second TSV output terminals of said second die.

15. The die stack of claim 14, wherein each of said first and second die further comprises:
   a steering logic circuit for controlling said first multiplexer to select said first local data signal and said second multiplexer to select said second TSV data signal in a first mode, and controlling said first multiplexer to select said first TSV data signal and said second multiplexer to select said first local data signal in a second mode.

16. The die stack of claim 14, wherein each of said first TSV output terminal and said second TSV output terminal of each of said first and second die comprises a hybrid bond landing pad.

17. The die stack of claim 14, wherein said first and second TSVs of said first die are bonded to said first and second TSV output terminals of said second die using hybrid bonding.

18. A method of transmitting signals between integrated circuit dice in a die stack comprising:
   multiplexing between a first through-silicon via (TSV) data signal from a first TSV input terminal through a first TSV and a first local data signal and outputting a first multiplexed signal;
   transmitting said first multiplexed signal to a first TSV output terminal;
   multiplexing between a second TSV data signal from a second TSV input terminal through a second TSV and a second local data signal and outputting a second multiplexed signal;
   transmitting said second multiplexed signal to a second TSV output terminal;
   selecting said first local data signal and said second TSV data signal in a first mode; and
   selecting said first TSV data signal and said second local data signal in a second mode.

19. The method of claim 18, further comprising:
   forming said first TSV output terminal as a first hybrid landing pad on a second major surface of an integrated circuit; and
   forming said second TSV output terminal as a second hybrid landing pad formed on said second major surface of said integrated circuit.

20. The method of claim 18, further comprising:
   configuring a first die in said first mode;
   configuring a second die in said second mode; and
   bonding a first major surface of said first die to a second major surface of said second die to form a die stack.

21. The method of claim 20, wherein:
   said configuring a first die in said first mode comprises setting a mode register during operation.

22. The method of claim 20, wherein:
   said configuring a first die in said first mode comprises programming a metal option during manufacturing.

23. The method of claim 20, wherein said bonding comprises hybrid bonding.

* * * * *